United States Patent [19]

Yavelberg

[11] Patent Number: 5,716,877

[45] Date of Patent: Feb. 10, 1998

[54] PROCESS GAS DELIVERY SYSTEM

[75] Inventor: Simon Yavelberg, Cupertino, Calif.

[73] Assignee: Applied Materials, Inc., Santa Clara, Calif.

[21] Appl. No.: 818,653

[22] Filed: Mar. 17, 1997

Related U.S. Application Data

[62] Division of Ser. No. 598,937, Feb. 8, 1996, Pat. No. 5,641,359.

[51] Int. Cl.$^6$ .................................................. H01L 21/00
[52] U.S. Cl. ................... 438/14; 156/345; 216/63; 216/67; 438/706; 438/710; 438/730
[58] Field of Search .................. 156/345 V, 345 MT; 216/63, 67, 58, 59; 438/14, 706, 710, 730

[56] References Cited

U.S. PATENT DOCUMENTS 3,723,289 3/1973 Boom ........................ 156/345 X
4,699,689 10/1987 Bersin ........................ 156/345 X
4,888,088 12/1989 Slomowitz .................. 156/345 X

*Primary Examiner*—William Powell
*Attorney, Agent, or Firm*—Michael A. Glenn; Peter J. Sgarbossa

[57] ABSTRACT

A system for extending the tuning ranges of various parameters that control plasma ignition within a process chamber effectively reduces the RF power level necessary for plasma ignition within the process chamber. A central conductor is coaxially disposed within a conduit that conveys a process gas to the process chamber. The process gas is energized within the conduit by application of an RF power source thereto. In particular, process gas molecules flowing through the conduit are excited by the RF power which is coupled to the central conductor. The excited process gas is then injected into the process chamber. An RF or microwave power source is supplied to the process chamber using conventional techniques to stimulate the excited gas and thereby ignite a plasma therein.

3 Claims, 2 Drawing Sheets

PROCESS GAS DELIVERY SYSTEM

This is a divisional of application Ser. No. 08/598,937 filed on Feb. 8, 1996, now U.S. Pat. No. 5,641,359.

BACKGROUND OF THE INVENTION

1. Technical Field

The invention relates to plasma-based processing equipment, such as semiconductor wafer processing chambers. More particularly, the invention relates to a gas delivery system that stimulates a process gas prior to delivery to a process environment, and thereby reduces the amount of power that is necessary for plasma generation within said process chamber.

2. Description of the Prior Art

Plasma etching processes are widely used during the fabrication of integrated circuits on silicon wafers. During such processing, the wafers are exposed to a gaseous plasma within a process chamber. Radio frequency energy (hereinafter referred to as "RF"), typically at a frequency of 13.56 MHz, is used to agitate a reactive process gas that is supplied to the process chamber and thereby generate a plasma. The plasma is generated either within the process chamber or at a remote location, for example with the use of a plasma applicator. The process gas is typically pumped through a conduit and enters the process chamber through holes in a gas distribution plate (hereinafter referred to as a "GDP") or by gas injectors. Plasma ignition within the process chamber is dependent upon a specific set of parameters that include, for example chamber pressure, RF power levels, temperature, flow rate, and composition of the gas.

Frequently, a range for a specific parameter has very narrow limits within which plasma ignition may be achieved. Thus, during transport of the process gas to the process chamber through a conduit, and upon introduction of the process gas into the process chamber, the gas may be subjected to a wide range of local conditions that may ultimately affect plasma ignition. For example, variations or gradients in temperature and pressure can affect the contents of the conduit, such that one or more constituent elements of the process gas may become condensed and form a vapor within the conduit, e.g. water condensation may occur within the conduit.

Such vapor condensation is highly undesirable because it can alter the mixture of gases entering the process chamber and, thus, significantly affect plasma ignition within the process chamber. Also, a reduction in gas pressure typically increases the amount of RF energy required to ignite the plasma. The resulting increase in the amount of time that is required to generate the plasma can significantly affect the quality of the etching process within the process chamber. It is further desirable to limit the level of RF energy if possible, at least during plasma ignition, because it is thought that lower plasma ignition levels are less likely to damage the delicate device structures formed on semiconductor wafers.

The difficulty associated with maintaining all of these operating parameters at the optimum or, minimally, at the requisite levels is a significant disadvantage of prior art plasma generation processes. An additional problem, most commonly associated with remote plasma generation, is that of sputtering within the conduit and on the walls of the process chamber. Such sputtering can affect the plasma flow into the process chamber, and is also a source of contamination. In particular, such condition can produce a polymer build-up on conduit and process chamber surfaces. Such polymer build-up can flake off of these surfaces during wafer processing, thereby producing contaminating particles. The problem is particularly acute because it is currently extremely difficult to monitor the variables that control the generation of a remote plasma.

It would therefore be a significant advance in the art to provide a system that allows more accurate control of the various parameters that determine plasma ignition within a process chamber. It would be a further advantage if such a system also resulted in a reduction in the RF power levels that are necessary for plasma generation, especially in view of the continual reduction in size of integrated circuit features formed on the wafer.

SUMMARY OF THE INVENTION

The invention provides a gas delivery system that allows more accurate control of the parameters that determine plasma ignition, while reducing the RF power levels required for such plasma ignition. In the preferred embodiment of the invention, a central conductor is coaxially disposed within a gas delivery conduit. A process gas that is conveyed within the conduit from an inlet port to an outlet port is energized by application of an RF power source thereto. One or more impedance matching elements may be provided to match the impedance of the power source to the impedance of the conduit, such that the conduit provides a tuned gas delivery medium.

Process gas molecules flowing through the conduit are excited by the RF power source, which is coupled to the central conductor. The excited process gas is then injected into the process chamber in accordance with standard practices. A conventional RF or microwave power source within the process chamber agitates the excited process gas, thereby igniting a plasma within the process chamber.

DETAILED DESCRIPTION OF THE INVENTION

The invention provides a gas delivery system that improves control of some of the various parameters that control plasma ignition. In practice, process gas molecules are remotely excited within a gas conveying conduit and then injected into a process chamber in an excited state. As a result, the power levels that are necessary to ignite a plasma are significantly reduced. Thus, a plasma may be ignited at lower power levels with a concomitant reduction in the deleterious effects to the delicate integrated circuit structures formed on the wafer surface that are associated with the use of excessive levels of RF or microwave energy to establish a plasma within the process chamber.

Figure 1:
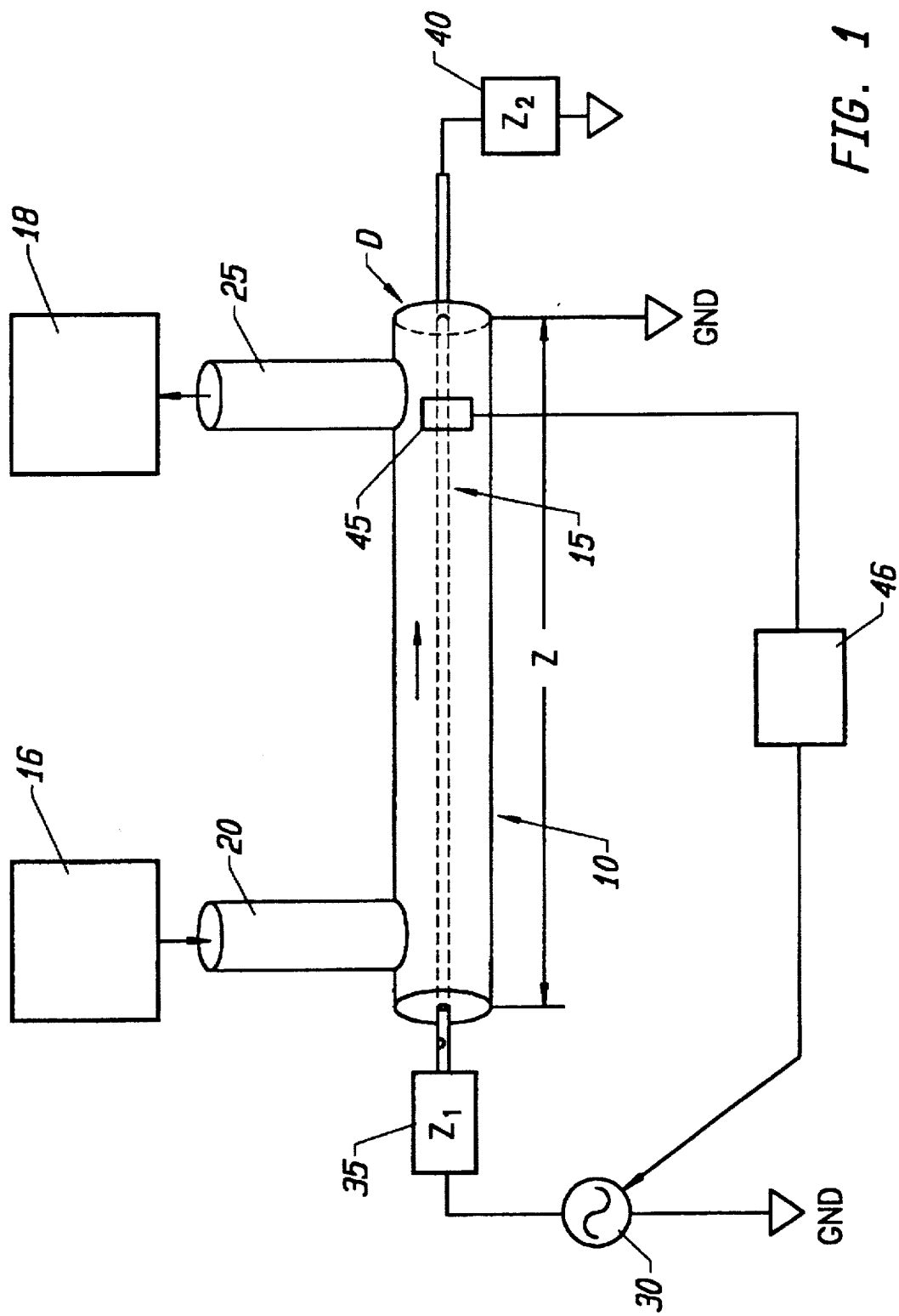
FIG. 1 is a schematic side view of the RF coaxial gas delivery system according to the preferred embodiment of the invention.

FIG. 1 is a schematic side view of the RF coaxial gas delivery system according to the invention. In the figure, a central conductor 15 is shown coaxially disposed within a conduit 10. In the preferred embodiment of the invention, the conduit provides a medium for process gas delivery from a gas source 16 to a process chamber 18. In the preferred embodiment, the conduit is formed of an anodized metal, such as stainless steel or aluminum, or other material having a dielectric inner surface. The conduit is preferably shielded.

In one embodiment of the invention, the conduit is isolated and formed of a non-conductive material. This arrangement is well suited to prevent the striking of a plasma within the conduit, and resulting, unwanted material sputtering and polymer deposition is thereby eliminated.

The exemplary conduit is about 8 inches in length and about ⅛ inches in diameter. The actual dimensions of the conduit for any particular application are dependent upon the parameters of the process that is implemented within the process chamber, such as RF source frequency and gas flow rate, as well as chamber size, process gas constituency, and degree of gas excitation desired. In alternate embodiments of the invention, the geometry of the conduit is readily adapted to conform to the particular process requirements (see the discussion below in connection with FIG. 2).

In the preferred embodiment of the invention, the coaxial central conductor is an electroconductive rod or cable. However, in alternate embodiments of the invention, the central conductor may comprise a tube that is coaxially arranged within the conduit. The central conductor is preferably formed of an anodized metal, such as stainless steel or aluminum. However, harder materials such as titanium are also suitable. In one embodiment, the tube consists of an electroconductive rod that has an anodized outer surface. As such, the rod is insulated. This arrangement protects the conductor from possible reaction with the process gas that may result in deterioration of the conductor and/or generation of contaminating particles. In another embodiment of the invention, the tube itself is conductive and provides a hollow core that may contain or transport a fluid within. The interior wall of such tube may be optionally isolated and non-conductive to prevent the striking of a plasma within the conduit, as well as associated material sputtering (discussed above). If required, ceramic or other nonconductive, process inert spacers may be placed at locations within the conduit to support the central conductor and hold same rigid therein.

A power source 30 energizes the central conductor. In the preferred embodiment of the invention, the power source is an RF source, having a frequency of 13.56 MHz and a power range of about 50 to 300 watts. Other frequency and power ranges for the RF power source may selected to suit the specific requirements of differing plasma generation processes.

A process gas is introduced into the conduit through an inlet port 20. The gas molecules flow through the conduit and past the central conductor prior to exiting the conduit through an outlet port 25. It is critical to note that the output of the process gas channels should be conducted via a non-metallic material, such as a ceramic material, because it is thought that a metallic material absorbs or delivers electrons, and thus removes energy from the process gas, thereby defeating the purpose of the invention, i.e. to impart energy to the process gas prior to delivery to a process chamber.

The preferred embodiment of the invention is used in connection with a plasma etching process. The process gases flowing through the conduit are therefore those most commonly associated with dry etching, including chlorine, fluorine, oxygen, and combinations thereof. Alternate embodiments of the invention are suited for other plasma-enhanced processes, such as chemical vapor deposition. The parameters of the gas delivery system, such as power level, RF frequency, fluid, and flow rate, are thus readily modified to generate the process gas compositions required for different plasma-enhanced processes.

Process gas molecules flowing through the conduit are excited prior to their injection into the process chamber by the RF energy that is coupled to the central conductor. Typical process gas flow rates are about 20–200 sccm, with process chamber pressures on the order of about 10–30 mTorr. The outlet of the coaxial gas delivery system of the invention is preferably coupled to a manifold, and then to a plurality of injectors within the chamber. Alternative embodiments of the invention may employ a gas distribution plate within the process chamber as a process gas delivery port. An RF or microwave energy source is applied to the process chamber using conventional techniques to ignite the excited gas, and thereby strike a plasma. As a result of the increased energy level imparted to the excited gas molecules within the gas delivery conduit, less energy is required to ignite the plasma than is required by prior art plasma generation processes.

The impedance of the RF source is typically 50Ω. The impedance of the RF source must be matched to that of the conduit to insure that RF power coupled to the coaxial gas delivery system is not reflected back to the RF generator. That is, it is preferred to avoid a high standing wave ratio between the RF source and the conduit, such that maximum energy transfer to the process gas is possible within the conduit. Accordingly, it is preferred that one or more impedance elements 35, 40 be provided to match the impedance of the power source with that of the conduit. The impedance of the conduit plus the impedance elements is therefore chosen, for example, to equal the 50Ω required to match the impedance of the conduit to that of the source. In the preferred embodiment of the invention, the impedance elements are comprised of inductors and capacitors that are coupled to tune the conduit using conventional impedance matching techniques.

The various parameters of the coaxial gas delivery system herein described are readily monitored to insure that the gas molecules are excited to the proper level. For example, the preferred embodiment of the invention includes a feedback system to detect plasma ignition within the conduit, i.e. premature plasma ignition. Plasma is a source of visible light, typically of the ultraviolet (UV) wavelength. A light detector 45 located within the conduit is responsive to the presence of light, thereby indicating plasma ignition. Once plasma generation is indicated, the RF power supplied to the central conductor within the conduit is reduced by a control circuit 46 to extinguish the plasma. Thus, the invention insures that the gas molecules are consistently excited to the required level, without prematurely generating a plasma. Such plasma detection systems are well known in the art and readily adapted for use with the subject invention.

Figure 2:
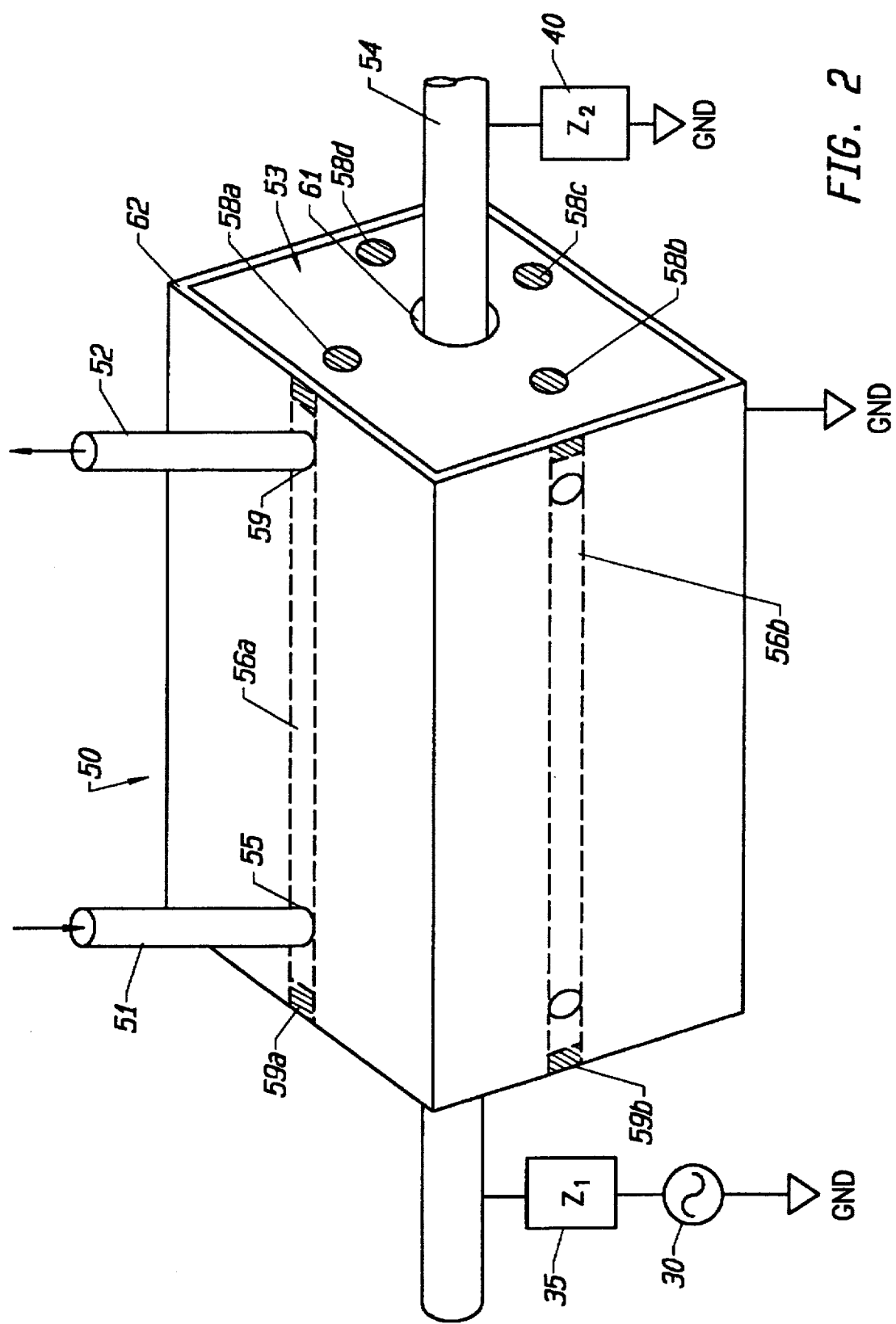
FIG. 2 is a schematic perspective view of the RF coaxial gas delivery system according to another, equally preferred embodiment of the invention.

FIG. 2 is a schematic perspective view of the RF coaxial gas delivery system 50 according to another, equally preferred embodiment of the invention. A block 53 of quartz or ceramic materials, for example, is bored longitudinally using techniques to provide a first aperture 61 therethrough that accommodates an anodized central conductor 54. One or more apertures 56a, 56b are also bored longitudinally through the block 53 to provide process gas channels. In the embodiment of the invention shown in FIG. 2, each such channel is plugged at each end with a process compatible plug 58a, 58b, 58c, 58d, 59a, 59b, e.g. made of a ceramic material. It will be appreciated that although two process gas channels are shown in FIG. 2, the exemplary embodiment of the invention provides four such channels. However, the number of such channels is a matter of choice as appropriate for the process to which the invention is applied.

Apertures 55, 59 are bored into the block 53 to intersect with the process gas channels to provide a process gas inlet and outlet port for each channel, respectively. A source of process gas is then coupled to the process gas channels through a supply tube 51 and the gas is then exhausted in an excited state from the process gas supply channels for delivery to a process chamber via an exhaust tube 52. Finally, if desired, the block 53 may be surrounded by a shield 62 which is grounded.

In alternative embodiments of the invention, the process gas channels may be left open, such that one end of each channel provides a process gas inlet port, while the other end of the process gas channel provides a process gas outlet port. A suitable gasket/manifold may be placed at each end of the block to couple the process gas from a gas source to the block, and from the block to a process chamber. The fabrication of such arrangement is considered to be within the skill of those familiar with the relevant art.

Although the invention is described herein with reference to the preferred embodiment, one skilled in the art will readily appreciate that other applications may be substituted for those set forth herein without departing from the spirit and scope of the invention. For example, the orientation of the coaxial gas delivery system of the invention is conformable to the particular structure of the vacuum Chamber, i.e. the conduit may be situated as appropriate relative to the gas inlet of the process chamber, e.g. at the top or side of the process chamber. Accordingly, the invention should only be limited by the claims included below.

I claim:

1. A method for delivering an agitated process gas to a process chamber, comprising the steps of:

introducing said process gas into a conduit at a conduit inlet port;

energizing a conductor disposed within said conduit by application of an energy source thereto, wherein said process gas is placed in an agitated state but is not agitated such that a plasma is ignited within the conduit; and delivering said agitated gas to said process chamber from an outlet port formed in said conduit.

2. The method of claim 1, further comprising the step of:

monitoring said conduit to detect ignition of a plasma therein; and generating a signal indicative of plasma ignition within said conduit when such ignition occurs.

3. The method of claim 2, further comprising the step of:

maintaining said power source at a level that does not result in plasma ignition within said conduit, responsive to said generated signal.

* * * * *